United States Patent
Ishiguro et al.

(10) Patent No.: US 10,115,904 B2
(45) Date of Patent: Oct. 30, 2018

(54) TRANSPARENT RESIN COMPOSITION FOR ORGANIC ELECTROLUMINESCENT ELEMENT SEALING, RESIN SHEET FOR ORGANIC ELECTROLUMINESCENT ELEMENT SEALING, AND IMAGE DISPLAY DEVICE

(71) Applicant: FURUKAWA ELECTRIC CO., LTD., Tokyo (JP)

(72) Inventors: Kunihiko Ishiguro, Tokyo (JP); Tetsuya Mieda, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 376 days.

(21) Appl. No.: 14/857,335

(22) Filed: Sep. 17, 2015

(65) Prior Publication Data

US 2016/0005973 A1  Jan. 7, 2016

Related U.S. Application Data

(63) Continuation of application No. PCT/JP2014/055836, filed on Mar. 6, 2014.

(30) Foreign Application Priority Data

Mar. 19, 2013  (JP) .................. 2013-055900

(51) Int. Cl.
| | |
|---|---|
| *C08L 53/00* | (2006.01) |
| *H01L 51/00* | (2006.01) |
| *C08K 5/00* | (2006.01) |
| *C08K 5/098* | (2006.01) |
| *H01L 27/32* | (2006.01) |
| *H01L 51/52* | (2006.01) |

(52) U.S. Cl.
CPC ........ *H01L 51/0043* (2013.01); *C08K 5/0091* (2013.01); *C08K 5/098* (2013.01); *C08L 53/005* (2013.01); *H01L 27/32* (2013.01); *H01L 51/004* (2013.01); *H01L 51/0035* (2013.01); *H01L 51/0081* (2013.01); *H01L 51/5237* (2013.01); *H01L 51/524* (2013.01); *H01L 2251/558* (2013.01)

(58) Field of Classification Search
CPC . H01L 51/0043; H01L 27/32; H01L 51/0035; H01L 51/004; H01L 51/0081; H01L 51/5237; H01L 51/524; H01L 2251/558; C08K 5/0091; C08K 5/098; C08L 53/005
USPC ........................................................ 524/505
See application file for complete search history.

(56) References Cited

U.S. PATENT DOCUMENTS

| | | | |
|---|---|---|---|
| 2003/0110981 A1 | 6/2003 | Tsuruoka et al. | |
| 2006/0216457 A1 | 9/2006 | Takahashi et al. | |
| 2008/0220245 A1 | 9/2008 | Suzuki et al. | |
| 2011/0309342 A1 | 12/2011 | Tanaka et al. | |
| 2012/0037893 A1 | 2/2012 | Tanaka et al. | |
| 2012/0104373 A1 | 5/2012 | Inoue et al. | |

FOREIGN PATENT DOCUMENTS

| | | | |
|---|---|---|---|
| CN | 1842231 A | | 10/2006 |
| CN | 102397779 A | | 4/2012 |
| CN | 102585651 A | * | 7/2012 |
| JP | 11-199855 A | | 7/1999 |
| JP | 2003-144830 A | | 5/2003 |

(Continued)

OTHER PUBLICATIONS

Translation of CN 10258565, Jul. 18, 2012.*
Office Action dated May 16, 2017 in Korean Patent Application No. 10-2015-7023195 (with English language translation).
International Search Report dated Apr. 8, 2014, in PCT Application No. PCT/JP2014/055836 (with English Transalation).
Japanese Office Action dated Oct. 11, 2013, in Japanese Patent Application No. 2013-055900 (the basic application of PCT/JP2014/055836).

(Continued)

*Primary Examiner* — Hui H Chin
(74) *Attorney, Agent, or Firm* — Oblon, McClelland, Maier & Neustadt, L.L.P.

(57) ABSTRACT

A transparent resin composition for organic EL element sealing and other things having a sufficient moisture blocking effect and excellent flexibility is provided. A thermoplastic resin, a tackifying resin, and an organometallic compound having at least an ester bond and represented by the following formula are included, and in which the light transmittance for light is 85% or higher, the relationship: AM/Y<162 is satisfied, and the thermoplastic resin includes a hydride of a styrene-based A-B-A type triblock body.

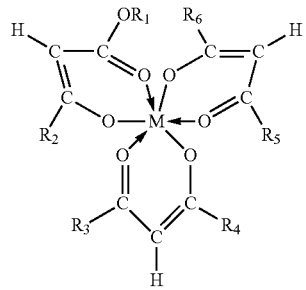

(wherein $R_1$, $R_2$, $R_4$ and $R_6$ represent organic groups including an alkyl group, an aryl group, a cycloalkyl group, and an acyl group each having a carbon number of 1~8; $R_3$ and $R_5$ represent organic groups including an alkyl group, an aryl group, an alkoxy group, a cycloalkyl group, and an acyl group each having a carbon number of 1~8; and M represents a trivalent metal atom.)

9 Claims, 2 Drawing Sheets

(56) References Cited

FOREIGN PATENT DOCUMENTS

| | | |
|---|---|---|
| JP | 2009-019077 A | 1/2009 |
| JP | 2010-080293 A | 4/2010 |
| JP | 4475084 B | 6/2010 |
| JP | 2012-038660 A | 2/2012 |
| JP | 5442147 B1 | 3/2014 |
| TW | 201040244 A1 | 11/2010 |
| TW | 201221620 A1 | 6/2012 |

OTHER PUBLICATIONS

Taiwanese Office Action dated May 20, 2015, in Taiwanese Patent Application No. 103110090 (corresponding to PCT/JP2014/055836).

Combined Chinese Office Action and Search Report dated Jul. 27, 2016 in Patent Application No. 201480015740.0 (with English language translation and Translation of Categories of Cited Documents).

* cited by examiner

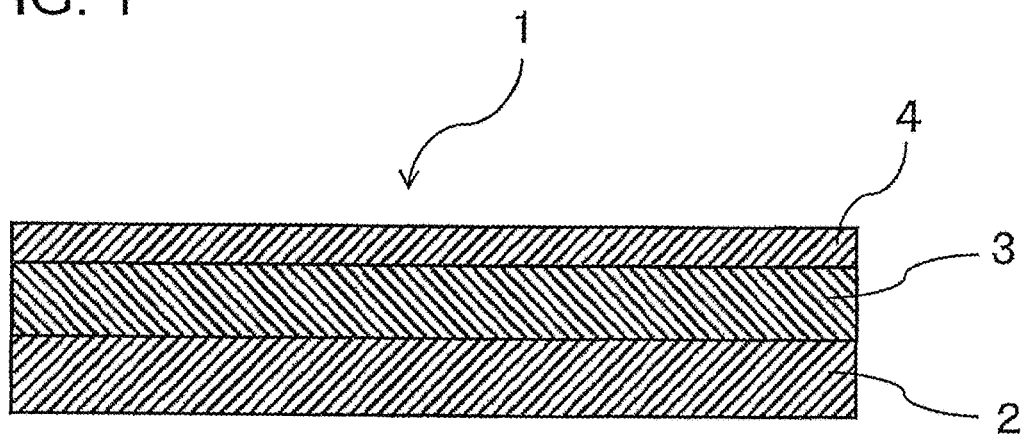
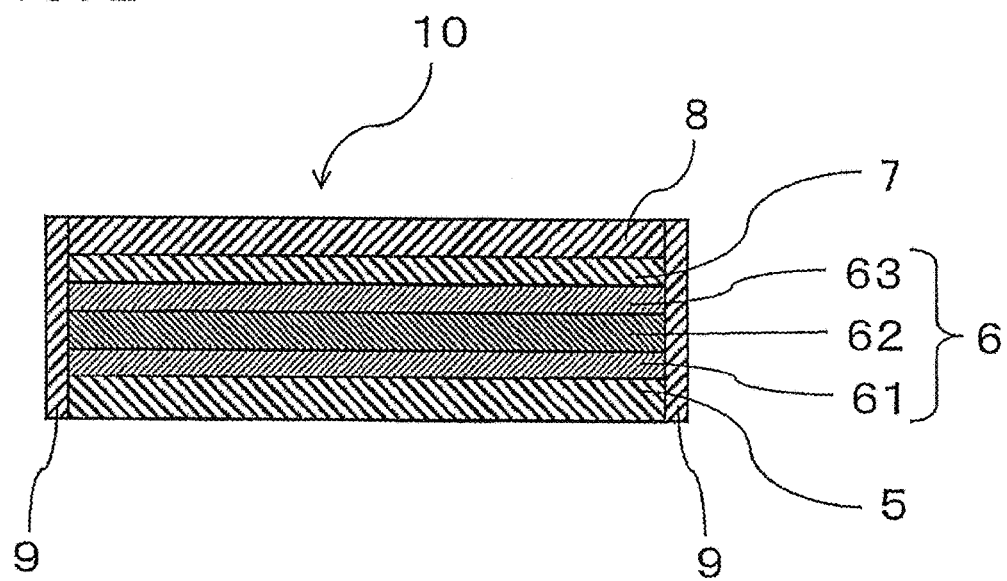

TRANSPARENT RESIN COMPOSITION FOR ORGANIC ELECTROLUMINESCENT ELEMENT SEALING, RESIN SHEET FOR ORGANIC ELECTROLUMINESCENT ELEMENT SEALING, AND IMAGE DISPLAY DEVICE

TECHNICAL FIELD

The present invention relates to a transparent resin composition for organic electroluminescent element sealing, which is used to seal the light emitting surface side of an organic electroluminescent element, a resin sheet for organic electroluminescent element sealing, and an image display device.

BACKGROUND ART

In recent years, research on organic electroluminescent (hereinafter, may also be referred to as "organic EL") displays, organic EL lightings, and various organic electronic devices such as organic semiconductors and organic solar cells has been actively conducted, and these devices are expected to serve as the next-generation displays that will replace liquid crystal displays (LCD's), or as the next-generation lightings that will replace light emitting diode (LED) lightings. Furthermore, since organic EL elements are such that all of the constituent elements thereof can be formed from solid materials, there is a possibility that organic EL elements may be used as flexible displays or lightings. An organic EL element has a basic configuration in which an anode layer, a light emitting layer, and a cathode layer are sequentially formed on a substrate made of glass or the like. As a voltage is applied between the anode layer and the cathode layer, the organic EL element undergoes self-luminescence, and light can be extracted from either side of the anode layer and the cathode layer. Therefore, a top emission mode and a bottom emission mode are available as the light emission mode of organic EL devices.

However, regarding the organic EL elements described above, if moisture, impurities and the like exist in the periphery of an element, non-light emitting areas called dark spots are generated and grow. When the dark spots grow to have a diameter of several ten micrometers (μm), the non-light emitting areas can be identified by visual inspection, and this leads to deterioration of visibility.

Thus, in order to shield an organic EL element from moisture, impurities and the like, the organic EL element is provided with a transparent sealing substrate made of glass or the like (also available is a sealing can), and an organic EL device in which a viscous material containing a dehydrating agent is filled in a space produced between the organic EL element and the sealing substrate has been disclosed (see, for example, Patent Document 1). However, it is necessary to use a dam material so as to prevent the viscous material from overflowing at the time of charging, and it was not possible to obtain a flexible organic EL device.

In order to obtain a flexible organic EL device, a method of sealing an organic EL device with a transparent sealing material formed from a thermoplastic resin has been disclosed (see, for example, Patent Document 2). However, the effect of shielding against moisture has not been sufficient.

CITATION LIST

Patent Document

Patent Document 1: JP 2012-038660 A
Patent Document 2: Japanese Patent No. 4475084

DISCLOSURE OF THE INVENTION

Problem to be Solved by the Invention

Thus, it is an object of the present invention to provide a transparent resin composition for organic electroluminescent element sealing which has a sufficient shielding effect against moisture and has excellent flexibility, a resin sheet for organic electroluminescent element sealing, and an image display device.

Means for Solving Problem

In order to solve the problems described above, the transparent resin composition for organic electroluminescent element sealing according to the present invention includes a thermoplastic resin, a tackifying resin, and an organometallic compound having at least an ester bond and represented by the following formula (Chemical Formula 1) as essential components, the resin composition having a light transmittance of 85% or higher for light having a wavelength of 550 nm at a thickness of 0.1 mm, in which composition the relationship: AM/Y<162 is satisfied when the acid value obtainable by excluding the organometallic compound represented by the formula (Chemical Formula 1) is designated as A (mg $CH_3ONa/g$); the weight average molecular weight of the organometallic compound represented by the formula (Chemical Formula 1) is designated as M; and the weight ratio of the organometallic compound represented by the formula (Chemical Formula 1) with respect to 100 parts by weight of the resin components is designated as Y, and the thermoplastic resin includes a hydride of a styrene-based A-B-A type triblock body:

[Chemical Formula 1]

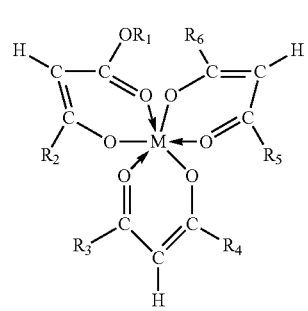

wherein $R_1$, $R_2$, $R_4$ and $R_6$ represent organic groups including an alkyl group, an aryl group, a cycloalkyl group, and an acyl group each having a carbon number of 1 or more and 8 or less; $R_3$ and $R_5$ represent organic groups including an alkyl group, an aryl group, an alkoxy group, a cycloalkyl group, and an acyl group each having a carbon number of 1 or more and 8 or less; M represents a trivalent metal atom; and $R_1$ to $R_6$ may be respectively identical organic groups or different organic groups.

Furthermore, in regard to the transparent resin composition for organic electroluminescent element sealing, the styrene-based A-B-A type triblock body is preferably any one or a combination of a styrene-ethylene-butylene-styrene copolymer, a styrene-ethylene-propylene-styrene copolymer, a styrene-ethylene-ethylene-propylene-styrene copolymer, and a styrene-isobutylene-styrene copolymer.

Furthermore, in regard to the transparent resin composition for organic electroluminescent element sealing, the tackifying resin is preferably any one or a combination of hydrides of C5-based petroleum resins, hydrides of C9-based petroleum resins, and hydrides of petroleum resins obtainable by copolymerizing a C5-based petroleum resin and a C9-based petroleum resin.

Furthermore, in order to solve the problems described above, the resin sheet for organic electroluminescent element sealing according to the present invention at least partially includes a sealing layer formed from any one of the transparent resin compositions for organic electroluminescent element sealing described above.

Furthermore, the image display device according to the present invention is obtained by interposing, in an image display device having at least an organic electroluminescent element and a sealing substrate provided on the surface of the organic electroluminescent element, the resin sheet for organic electroluminescent element sealing according to claim 4 between the organic electroluminescent element and the sealing substrate.

Effect of the Invention

The transparent resin composition for organic EL element sealing and the resin sheet for organic electroluminescent element sealing according to the present invention have excellent water absorbency and low moisture permeability, shield an organic EL element from moisture, and can suppress the generation of dark spots. The image display device according to the present invention can shield an organic EL element from moisture by means of the resin sheet for organic electroluminescent element sealing, and therefore, the image display device can suppress the generation of dark spots and enhance the visibility of images. Furthermore, since the transparent resin composition for organic EL element sealing according to the present invention has flexibility, the resin composition can fill the space between the organic EL element and the sealing substrate, and when a substrate having flexibility is used as the sealing substrate or as an element substrate of the organic EL element, the resin composition has an effect that the resin composition does not impair the flexibility. Furthermore, since the transparent resin composition for organic EL element sealing of the present invention has excellent transparency, even in a case in which the transparent resin composition is adhered to a transparent member such as a sealing substrate that constitutes a top emission type organic EL device, transparency of the transparent member is not deteriorated. As a result, the transparent resin composition for organic EL element sealing can be used irrespective of the light emission mode of an organic EL device.

BRIEF DESCRIPTION OF DRAWINGS

FIG. 1 is a cross-sectional view schematically illustrating the structure of a resin sheet for organic electroluminescent element sealing related to an embodiment of the present invention;

FIG. 2 is a cross-sectional view schematically illustrating the structure of an image display device which uses a resin sheet for organic electroluminescent element sealing related to the embodiment of the present invention.

MODE(S) FOR CARRYING OUT THE INVENTION

Figure 3A:
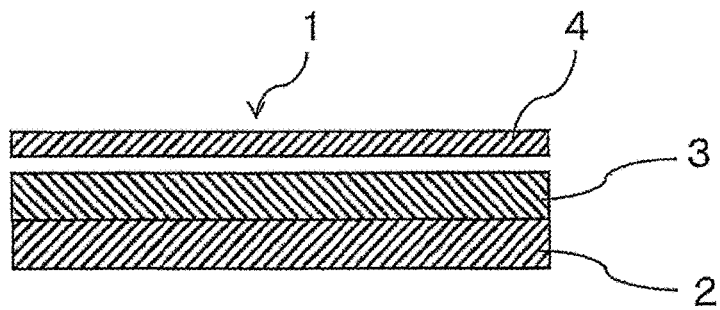
FIG. 3A~3D are explanatory diagrams for schematically describing the use of a resin sheet for organic electroluminescent element sealing related to the embodiment of the present invention.

Hereinafter, an embodiment of the present invention is described in detail.

A resin sheet for organic electroluminescent element sealing 1 related to the embodiment of the present invention has at least one sealing layer 3 on at least one side of a substrate sheet 2. FIG. 1 is an outline cross-sectional view illustrating a preferred embodiment of the resin sheet for organic electroluminescent element sealing 1 of the present invention. As illustrated in FIG. 1, the resin sheet for organic electroluminescent element sealing 1 has the substrate sheet 2, and the sealing layer 3 is formed on the substrate sheet 2. Also, the resin sheet for organic electroluminescent element sealing 1 further includes a release film 4 for protecting the sealing layer 3, on the sealing layer 3.

Hereinafter, the various constituent elements of the resin sheet for organic electroluminescent element sealing 1 of the present embodiment are described in detail.

(Substrate Sheet 2 and Release Film 4)

The substrate sheet 2 is intended to temporarily fix the resin composition for the purpose of improving handleability when the resin composition that constitutes the sealing layer 3 is made into a film form. Furthermore, the release film 4 is used for the purpose of protecting the sealing layer 3.

The substrate sheet 2 and the release film 4 are not particularly limited, and examples thereof include a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene-vinyl acetate copolymer film, an ionomer resin film, an ethylene-(meth)acrylic acid copolymer film, an ethylene-(meth)acrylic ester copolymer film, a polystyrene film, a polycarbonate film, a polyimide film, and a fluororesin film. Furthermore, crosslinked films of these films are also used. Laminate films of these films may also be used. Particularly, in view of cost, handleability and the like, it is preferable to use polyethylene terephthalate.

Regarding the peeling force when the sealing layer 3 is peeled off from the substrate sheet 2 and the release film 4, for example, the peeling force is preferably 0.3 N/20 mm or less, and more preferably 0.2 N/20 mm. There are no particular limitations on the lower limit of the peeling force, but a peeling force of 0.005 N/20 mm or more is practical. Furthermore, in order to improve handleability, it is preferable to use materials having peeling force different from that of the sealing layer 3 in the substrate sheet 2 and the release film 4.

The film thicknesses of the substrate sheet 2 and the release film 4 are usually 5 to 300 μl, preferably 10 to 200 μm, and particularly preferably about 20 to 100 μl.

(Sealing Layer 3)

The transparent resin composition for organic electroluminescent element sealing that constitutes the sealing layer 3 includes, as essential components, a thermoplastic resin, a tackifying resin, and an organometallic compound having at least an ester bond and represented by the following formula (Chemical Formula 1) as a desiccant:

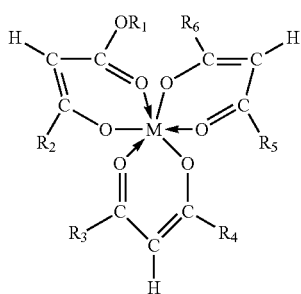

[Chemical Formula 1]

wherein $R_1$, $R_2$, $R_4$ and $R_6$ represent organic groups including an alkyl group having from, an aryl group, a cycloalkyl group, and an acyl group each having a carbon number of 1 or more and 8 or less; $R_3$ and $R_5$ represent organic groups including an alkyl group, an aryl group, an alkoxy group, a cycloalkyl group, and an acyl group each having a carbon number of 1 or more and 8 or less; M represents a trivalent metal atom; and $R_1$ to $R_6$ may be respectively identical organic groups or different organic groups.

[Thermoplastic Resin]

The thermoplastic resin includes a hydride of a styrene-based A-B-A type triblock body such as a styrene-ethylene-butylene-styrene copolymer, a styrene-ethylene-propylene-styrene copolymer, a styrene-ethylene-ethylene-propylene-styrene copolymer, a styrene-isobutylene-styrene copolymer, a styrene-isoprene-styrene copolymer, or a styrene-butadiene-styrene copolymer. The thermoplastic resin may be composed of one kind of hydride of a styrene-based A-B-A type triblock body, or may be composed of plural kinds of hydrides of styrene-based A-B-A type triblock bodies. Furthermore, the thermoplastic resin may also include other thermoplastic resins. The other thermoplastic resins are not particularly limited as long as the resins are transparent, and examples thereof include a cycloolefin polymer; a urethane-based thermoplastic elastomer resin; diblock rubber-based resins such as a styrene-butadiene block copolymer, a styrene-isoprene block copolymer, a styrene-ethylene-butene block copolymer, and a styrene-ethylene-propylene block copolymer; and rubbers such as polyisobutylene, butadiene rubber, and isoprene rubber. Hydrides of these resins are preferred.

When the thermoplastic resin includes a styrene-base A-B-A type triblock body, the adhesiveness to the organic EL element 6 (see FIGS. 2 and 3) and the range of selection for the tackifying resin is widened. Furthermore, by using a hydride, transparency and weather resistance are enhanced.

Regarding this A-B-A type block copolymer, the weight average molecular weight of the A block unit is preferably 1,000 to 500,000, and the weight average molecular weight of the B block unit is preferably 15,000 to 1,000,000. Meanwhile, the weight average molecular weight according to the invention is a value calculated based on a calibration curve produced by a gel permeation chromatographic (GPC) analysis, using polystyrene standard materials.

In regard to the A-B-A type block copolymer, if the content of the styrene component is less than 10 mol %, there are occasions in which the block copolymer may have excessively high tacky adhesiveness and may not manifest rubber elasticity. Therefore, the content is preferably 10 mol % or more. On the other hand, if the content of the styrene component is more than 40 mol %, there are occasions in which the block copolymer may have excessively weak tacky adhesiveness and become hard, and the block copolymer may not manifest rubber elasticity. Therefore, the content of the styrene component is preferably 40 mol % or less.

The A-B-A type block copolymer is commercially available from, for example, Zeon Corp., Asahi Kasei Chemicals Corp., Kuraray Co., Ltd., JSR Corp., and Kaneka Corp.

[Tackifying Resin]

The tackifying resin is used for the purpose of imparting appropriate viscosity and adhesiveness. Examples of the tackifying resin include rosin, rosin derivatives (hydrogenated rosin, disproportionated rosin, polymerized rosin, rosin esters (such as a rosin esterified with alcohol, glycerin, pentaerythritol etc.)), terpene resins (α-pinene and β-pinene), terpene-phenol resins, aromatic modified terpene resins, hydrogenated terpene resins, C5-based petroleum resins, C9-based petroleum resins, petroleum resins obtainable by copolymerizing C5-based petroleum resins and C9-based petroleum resins, DCPD type petroleum resins, hydrides of C5-based petroleum resins, hydrides of C9-based petroleum resins, hydrides of petroleum resins obtainable by copolymerizing C5-based petroleum resins and C9-based petroleum resins, hydrides of DCPD type petroleum resins, coumarone-indene resins, styrene-based resins, phenolic resins, and xylene resins.

Among them, one or more selected from the group consisting of hydrides of C5-based petroleum resins, hydrides of C9-based petroleum resins, hydrides of petroleum resins obtainable by copolymerizing C5-based petroleum resins and C9-based petroleum resins, hydrides of DCPD type petroleum resins, hydrogenated rosin-based resins, and hydrogenated terpene-based resins, are suitably used from the viewpoint that a resin composition having satisfactory compatibility with the thermoplastic resin described above and excellent transparency can be formed. Among these, a hydride of a 05-based petroleum resin, a hydride of a C9-based petroleum resin, and a hydride of a petroleum resin obtainable by copolymerizing a C5-based petroleum resin and a C9-based petroleum resin are suitably used from the viewpoint of having satisfactory water vapor barrier capacity.

The softening point of the hydride of a petroleum resin is preferably 60° C. to 150° C. If the softening point is lower than 60° C., the cohesive force of the composition is decreased, and therefore, the retention characteristics at high temperatures are deteriorated. If the softening point is higher than 150° C., sealability is deteriorated because fluidity of the composition is decreased.

The hydride of the petroleum resin is commercially available from, for example, Arakawa Chemical Industries, Ltd. and Idemitsu Kosan Co., Ltd.

[Desiccant]

The desiccant is used for the purpose of capturing the moisture that permeates the resin composition. By capturing moisture, moisture-induced deterioration of the organic EL element 6 can be suppressed. Examples of the desiccant include metal oxides such as calcium oxide, magnesium oxide, and barium oxide; sulfuric acid salts such as magnesium sulfate, sodium sulfate, and nickel sulfate; and organometallic compounds such as aluminum ethyl acetoacetates.

Among them, an aluminum chelate having at least an ester bond as illustrated in Chemical Formula 1 is suitably used from the viewpoint of being capable of forming a resin composition having excellent transparency.

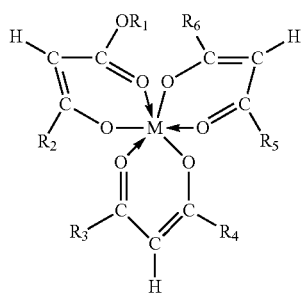

[Chemical Formula 1]

wherein $R_1$, $R_2$, $R_4$ and $R_6$ represent organic groups including an alkyl group, an aryl group, a cycloalkyl group, and an acyl group each having a carbon number of 1 or more and 8 or less; $R_3$ and $R_5$ represent organic groups including an alkyl group, an aryl group, an alkoxy group, a cycloalkyl group, and an acyl group each having a carbon number of 1 or more and 8 or less; M represents a trivalent metal atom; and $R_1$ to $R_6$ may be respectively identical organic groups or different organic groups.

The aluminum chelate having at least an ester bond is commercially available from, for example, Kawaken Fine Chemicals Co., Ltd.

When the weight average molecular weight of the desiccant is designated as M, the weight ratio of the desiccant relative to 100 parts by weight of the resin component is designated as Y, and the acid value of the transparent resin composition for organic EL element sealing excluding the desiccant is designated as A (mg $CH_3ONa/g$), it is desirable that the value calculated by the formula: AM/Y is less than 162. Since a transparent resin composition for organic EL element sealing for which the value has been adjusted to 162 or higher is thickened, a thin resin film cannot be obtained. Here, the resin component refers to all the resin components included in the transparent resin composition for organic EL element sealing, such as a plasticizer, in addition to the thermoplastic resin and the tackifying resin.

[Plasticizer]

The transparent resin composition for organic EL element sealing may include a plasticizer. Fluidity can be modified by introducing a plasticizer. Examples of the plasticizer include waxes, paraffin, phthalic acid esters, adipic acid esters, and polybutene.

[Other Additives]

The transparent resin composition for organic EL element sealing may include a silane coupling agent. When a silane coupling agent is used, the amount of chemical bonding to an adherend is increased, and the adhesive force is increased. Specific examples of the silane coupling agent include silane coupling agents such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)-3-aminopropylmethyldimethoxysilane, N-(2-aminoethyl)-3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)-3-aminopropyltrimethoxysilane hydrochloride, and 3-methacryloxypropyltrimethoxysilane. These silane coupling agents may be used as mixtures of two or more kinds thereof. The content of the silane coupling agent is preferably 0.05 to 10 parts by mass, and more preferably 0.1 to 1 part by mass, relative to 100 parts by mass of the resin composition.

As long as the purpose of the present invention can be achieved, other components, for example, a storage stabilizer, an oxidation inhibitor, a plasticizer, a tack modifier, and a resin stabilizer, can be further added; however, since there is a possibility that visibility of the image display device may be deteriorated by the moisture or impurities present in those additive components, caution should be taken.

The transparent resin composition for organic EL element sealing has a light transmittance of 85% or higher for light having a wavelength of 550 nm, at a thickness of 0.1 mm. It is because if the light transmittance at 550 nm is less than 85%, visibility is decreased. The light transmittance can be selected by appropriately selecting the resin.

[Method for Measuring Light Transmittance]

Light transmittance can be determined by measuring the amount of transmitted light using a spectrophotometer (spectrophotometer U-4100 type solid sample analytic system manufactured by Hitachi High-Technologies Corp.).

The transparent resin composition for organic EL element sealing may include a solvent on the occasion of obtaining a film-like sealing layer 3. Examples of such a solvent include organic solvents such as methyl ethyl ketone, toluene, ethanol, and isopropanol, and methyl ethyl ketone and toluene are particularly preferred. A resin solution obtained by adding the individual materials to be included in the resin composition, to such a solvent and mixing and dispersing the mixture, is applied on the releasable surface of the substrate sheet 2 directly or by transfer, according to a generally known method such as a roll knife coater, a gravure coater, a die coater, a reverse coater, or the like, and the resin solution is dried. Thus, the sealing layer 3 can be obtained.

Furthermore, regarding a technique for obtaining a film-like sealing layer 3 without using an organic solvent, the sealing layer 3 can be obtained by melting the transparent resin composition for organic EL element sealing at a high temperature, extruding the composition by a generally known technique such as a hot melt coater, and then cooling the resin composition.

The thickness of the sealing layer 3 is preferably 3 to 100 μm, and more preferably 5 to 50 μm.

Furthermore, it is more preferable that the surface roughness Ra of the sealing layer 3 and the object of pasting to be brought into contact with the sealing layer 3, is 2 μm or less. If this surface roughness is more than 2 μm, even if the conformity of the transparent resin composition for organic EL element sealing itself is high, the possibility that the sealing layer 3 may not conform to the surface of the object of pasting is increased. For this reason, when the surface roughness is in an appropriate range, the sealing layer 3 and the object of pasting are closely adhered, and therefore, visibility is enhanced. The surface roughness of the object of pasting can be changed by polishing or surface treatment, and the surface roughness of the sealing layer 3 can be modified by changing the surface roughness of the cooling roll when the sealing layer is formed into a film form, or by changing the surface roughness of the release film 4.

The resin sheet for organic electroluminescent element sealing 1 may have two or more layers of the sealing layer 3, or may have layers other than the sealing layer 3.

<Method of Use>

Next, the method of using the resin sheet for organic electroluminescent element sealing 1 is described.

The resin sheet for organic electroluminescent element sealing 1 of the present invention is used to obtain various organic electronic devices having a solid adhesion sealing structure, by disposing the resin sheet for organic electroluminescent element sealing 1 between an organic EL element 6 and a sealing substrate 8 (see FIGS. 2 and 3B~3D) that are provided on an element substrate 5 (see FIGS. 2 and 3D), and sealing the organic EL element 6 by adhesion with the element substrate 5 and the sealing substrate 8. Examples of the organic electronic device include organic EL displays, organic EL lightings, organic semiconductors, and organic solar cells.

As an example of the organic electronic device, an organic EL display (image display device) will be described below. As illustrated in FIG. 2, an organic EL display 10 is accommodated in a case 9 in a state such that an organic EL element 6 provided on an element substrate 5 is sealed by a sealing substrate 8 by means of a transparent resin layer for organic EL element sealing 7.

The organic EL element 6 includes, for example, as illustrated in FIG. 2, an anode 61 formed by patterning a conductive material, an organic layer 62 formed by a thin film of an organic compound material and laminated on the surface of the anode 61, and a cathode 63 laminated on the surface of the organic layer 62 and formed by patterning a transparent conductive material, on an element substrate 5 formed from a glass substrate or the like. Meanwhile, parts of the anode 61 and the cathode 63 protrude from an edge of the element substrate 5 and are connected to a driving circuit that is not illustrated in the diagram. The organic layer 62 is formed by laminating a hole injection layer, a hole transport layer, a light emitting layer, and an electron transport layer in this order from the anode 61 side, and the light emitting layer is formed by laminating a blue light emitting layer, a green light emitting layer, and a red light emitting layer. Meanwhile, the light emitting layer may also have non-luminescent intermediate layers between the various light emitting layers of blue, green and red colors.

For the sealing substrate 8, any material having properties that do not significantly inhibit visibility of the contents displayed by the organic EL display 10, may be used, and for example, glass or a resin can be used.

Figure 3B:
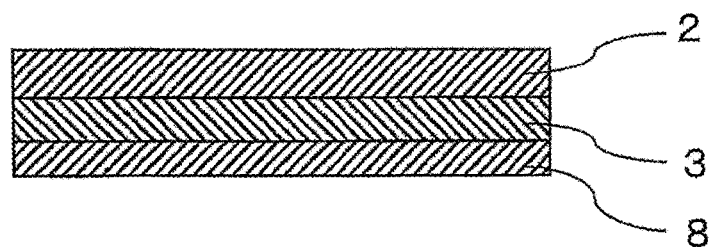
Figure 3C:
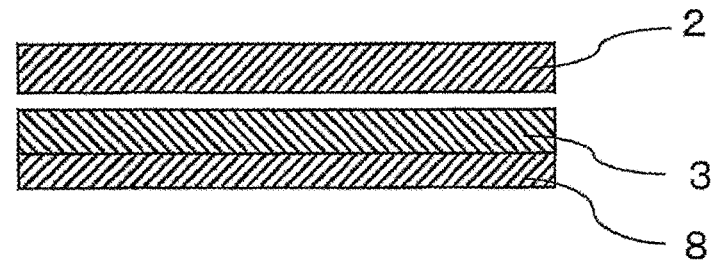
Figure 3D:
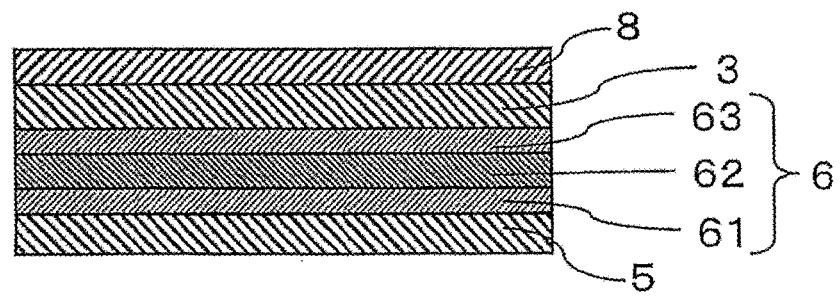

The transparent resin layer for organic EL element sealing 7 is formed using the resin sheet for organic electroluminescent element sealing 1 described above, and the transparent resin layer can be formed by the following procedure. First, as illustrated in FIG. 3A, the release film 4 of the resin sheet for organic electroluminescent element sealing 1 is peeled off, and as illustrated in FIG. 3B, the sealing layer 3 is roll-pasted to the sealing substrate 8. Next, as illustrated in FIG. 3C, the substrate sheet 2 of the resin sheet for organic electroluminescent element sealing 1 pasted to the sealing substrate 8 is peeled off. Thereafter, as illustrated in FIG. 3D, the sealing layer 3 of the resin sheet for organic electroluminescent element sealing 1 pasted to the sealing substrate 8 is laminated on the cathode 63 side of the organic EL element 6. The sealing layer 3 of the resin sheet for organic electroluminescent element sealing 1 constitutes the transparent resin layer for organic EL element sealing 7 in the organic EL display 10.

It is preferable that the pasting and lamination described above are carried out at a temperature of 100° C. or lower. If the temperature exceeds 100° C., the constituent materials of the organic EL element 6 are deteriorated, and there is a risk that the light emission characteristics may be deteriorated.

Meanwhile, in the step for forming the transparent resin layer for organic EL element sealing 7 described above, the resin sheet for organic electroluminescent element sealing 1 is initially roll-pasted to the sealing substrate 8; however, it is also acceptable to paste the resin sheet to the organic EL element 6. In this case, the substrate sheet 2 of the resin sheet for organic electroluminescent element sealing 1 is peeled off, and then the sealing layer 3 is laminated onto the sealing substrate 8.

Hereinafter, the configuration of the present invention is described in more detail by way of Examples, but the present invention is not intended to be limited to these.

Example 1

20 parts by weight of a styrene-ethylene-isoprene-styrene resin (manufactured by Kuraray Co., Ltd., SEPTON S2002, percentage of styrene content: 30%) as a thermoplastic resin, 70 parts by weight of a C9-based hydrogenated petroleum resin (manufactured by Arakawa Chemical Industries, Ltd., ARKON P100, softening point: 100° C.) as a tackifying agent, 5 parts by weight of aluminum tris(ethyl acetoacetate) (manufactured by Kawaken Fine Chemicals Co., Ltd., ALCH-TR, Al content: 6.5%) as a desiccant, and polybutene (manufactured by JX Nippon Oil & Energy Corp., NISSEKI POLYBUTENE HV-100, dynamic viscosity at 40° C.: 9500 $mm^2/s$) as a plasticizer were used.

The thermoplastic resin component was dissolved in toluene with stirring by adjusting the concentration of the thermoplastic resin component to a solid content of 20% by weight, and thus a thermoplastic resin solution was produced. The tackifying resin, the desiccant, and the plasticizer were added to the thermoplastic resin solution, and then the concentration was adjusted with toluene to a solid content of 30% by weight. The mixture was mixed and stirred until a uniform state was obtained, and thus a resin mixed solution was obtained.

On the releasable surface of a release-treated polyester film (manufactured by Teijin DuPont Films, Ltd., PUREX A-314) having a thickness of 50 μm as a substrate sheet, the resin mixed solution obtained as described above was applied to obtain a thickness of 50 μm, and then the resin mixed solution was heated and dried at 130° C. for 3 minutes. Thus, a sealing layer was formed. The sealing layer surface after drying was laminated on the releasable surface of a release-treated polyester film (manufactured by Toyobo Co., Ltd., TOYOBO ESTER FILM E7006) having a thickness of 25 μm as a release film, and thus a transparent resin sheet for organic EL element sealing having a uniform thickness and related to Example 1 was produced.

Examples 2 to 12

Transparent resin sheets for organic EL element sealing related to Examples 2 to 12 were produced in the same manner as in Example 1, except that the mixing compositions indicated in Table 1 were employed.

Comparative Examples 1 to 10

Transparent resin sheets for organic EL element sealing related to Comparative Examples 1 to 10 were produced in the same manner as in Example 1, except that the mixing compositions indicated in Table 2 were employed. Meanwhile, in Comparative Example 4 and Comparative Example 6, because gelation occurred in the resin mixed solutions after mixing and stirring, subsequent film formation was impossible.

(Raw Materials)

<Thermoplastic Resin>

A1: SEPTON S2002 (manufactured by Kuraray Co., Ltd.; hydrogenated styrene-ethylene-propylene-styrene copolymer)

A2: TUFTEC H1041 (manufactured by Asahi Kasei Chemicals Corp.; hydrogenated styrene-ethylene-butylene-styrene copolymer)

A3: TUFTEC M1913 (manufactured by Asahi Kasei Chemicals Corp.; hydrogenated styrene-ethylene-butylene-styrene copolymer, acid-modification product)

A4: SEPTON S4033 (manufactured by Kuraray Co., Ltd.; hydrogenated styrene-ethylene-ethylene-propylene-styrene-copolymer)

A5: SIBSTAR 103T (manufactured by Kaneka Corp.; hydrogenated styrene-isobutylene-styrene copolymer)

A6: QUINTAC 3280 (manufactured by Zeon Corp.; styrene-isoprene-styrene copolymer)

A7: JSR TR2601 (manufactured by JSR Corp.; styrene-butadiene-styrene copolymer)

A8: OPPANOL B15SFN (manufactured by BASF SE; polyisobutylene)

<Tackifying Resin>

B1: ARKON P100 (manufactured by Arakawa Chemical Industries, Ltd.; C9-based hydrogenated petroleum resin)

B2: I-MARV P100 (manufactured by Idemitsu Kosan Co., Ltd.; C5/C9-based hydrogenated petroleum resin)

B3: PETCOAL 100T (manufactured by Tosoh Corp.; C9-based petroleum resin)

B4: PINE CRYSTAL KE311 (manufactured by Arakawa Chemical Industries, Ltd.; hydrogenated rosin ester)

<Desiccant>

C1: ALCH-TR (manufactured by Kawaken Fine Chemicals Co., Ltd.; compound represented by the following formula (Chemical Formula 2), molecular weight: 414)

C2: Aluminum chelate D (manufactured by Kawaken Fine Chemicals Co., Ltd.; compound represented by the following formula (Chemical Formula 3), molecular weight: 384)

C3: Aluminum mono(acetylacetonato)bis(2-ethylhexyl acetoacetate) (1.0 ml of 2-ethylhexyl acetoacetate and 0.5 mol of acetylacetone were added dropwise to 0.5 mol of aluminum triisopropoxide, and the mixture was heated to 100° C. while stirred, and was heated to reflux for 1 hour. Compound represented by the following formula (Chemical Formula 4) and obtained by subjecting 2-propanol thus produced to fractional distillation, molecular weight: 553)

C4: Aluminum chelate A (W) (manufactured by Kawaken Fine Chemicals Co., Ltd.; compound represented by the following formula (Chemical Formula 5), molecular weight: 324)

C5: Aluminum mono(acetylacetonato)bis(dodecyl acetoacetate) (1.0 mol of dodecyl acetoacetone and 0.5 mol of acetylacetone were added dropwise to 0.5 mol of aluminum triisopropoxide, and the mixture was heated to 100° C. while stirred and was heated to reflux for 1 hour. Compound represented by the following formula (Chemical Formula 6) and obtained by subjecting 2-propanol thus produced to fractional distillation, molecular weight: 609)

[Chemical Formula 2]

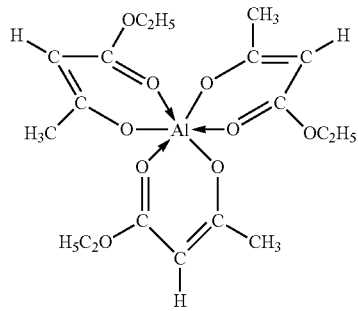

[Chemical Formula 3]

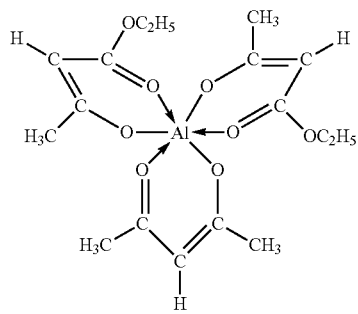

[Chemical Formula 4]

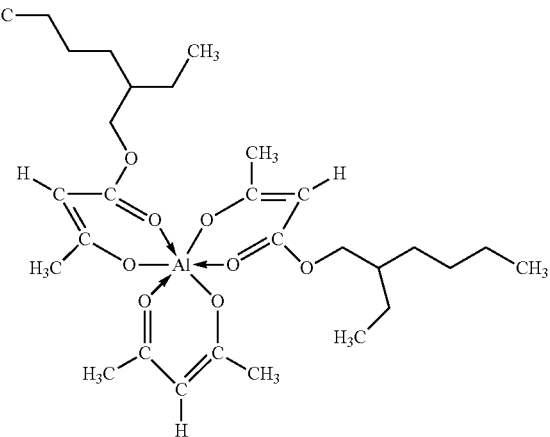

[Chemical Formula 5]

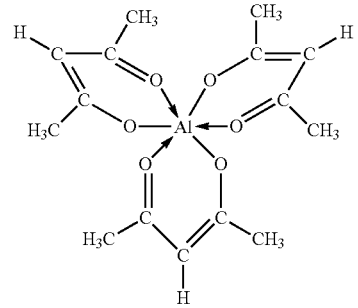

-continued

[Chemical Formula 6]

<Plasticizer>
D1: NISSEKI POLYBUTENE HV-100 (manufactured by JX Nippon Oil & Energy Corp.; polybutene)
(Evaluation Methods)
Evaluations were carried out according to the following evaluation methods. The results are presented in Table 1 and Table 2.
<Acid Value>
A mixed solution of a resin composition excluding the desiccant was adjusted with toluene to have a solid content of 30% by weight, and then 1 g of each acid-modified resin was subjected to neutralization titration using sodium methoxide ($CH_3ONa$). Thus, the mass (mg) of sodium-methoxide ($CH_3ONa$) used for the neutralization titration was measured as the acid value.
<AM/Y>
The value of AM/Y obtainable when the acid value of a transparent resin composition for organic EL element sealing was designated as A (mg $CH_3ONa$/g), the molecular weight of the desiccant was designated as M, and the weight ratio of the desiccant relative to 100 parts by weight of the resin components was designated as Y, was calculated.
<Solution Stability>
The presence or absence of gelation when a resin mixed solution after mixing and stirring of all the components was left to stand for 1 hour at 23° C. and was filtered through a stainless steel mesh with a wire diameter of 0.6 mm×16 mesh, was evaluated by visual inspection. A case in which a gel-like material was recognized on a mesh was rated as X, and a case in which no gel-like material was recognized was rated as ○.
<Light Transmittance>
The light transmittance of a transparent resin composition for organic EL element sealing was determined using a spectrophotometer (spectrophotometer U-4100 type solid sample analytic system manufactured by Hitachi High-Technologies, Ltd.). Specifically, a transparent resin sheet for organic EL element sealing adjusted to a thickness of 0.1 mm by pasting at 80° C., and the amount of transmitted light at 550 nm at 25° C. was determined.
<Adhesive Force>
The release-treated polyester film having a thickness of 25 µm of the transparent resin sheet for organic EL element sealing thus produced was peeled off, and an easy adhesion-treated polyester film (manufactured by Teijin-DuPont Film, Ltd., G2-C) having a thickness of 38 µm was pasted thereon at 80° C. Subsequently, the release-treated polyester film having a thickness of 50 µm was peeled off, and the resultant was used as a specimen. On the surface of the sealing layer of the specimen thus obtained, a glass plate according to JIS R3202 as an adherend was pasted at 80° C., and the specimen was peeled off from the adherend by the 180° peel test according to JIS Z0237 to thereby evaluate the adhesive force.
<Retentive Power>
A specimen was produced in the same manner as in the evaluation for adhesive force described above. On the surface of the sealing layer of the specimen thus obtained, a glass plate according to JIS R3202 as an adherend was pasted at a pasting temperature of 80° C., a defined weight was hung therefrom according to JIS Z0237, and the shifted distance after the passage of 24 hours at 100° C. was evaluated as the retentive power. Meanwhile, when the specimen fell off within 24 hours, it was indicated as ">25".
<Dark Spot>
An organic EL element having an anode on an element substrate formed from insulating transparent glass, and having an organic layer on the upper surface of the anode and a cathode on the upper surface of the organic layer, was produced. Subsequently, the release-treated polyester film having a thickness of 25 µm of the produced transparent resin sheet for organic EL element sealing was peeled off, and the transparent resin sheet was disposed on the surface of the cathode of the organic EL element. Thereafter, the release-treated polyester film having a thickness of 50 µm of the transparent resin sheet for organic EL element sealing was peeled off, and the insulating transparent glass as a sealing substrate was disposed on the surface of the sealing layer of the transparent resin sheet for organic EL element sealing. The assembly was pressed for one minute at a pressure of 0.6 MPa at 80° C. under reduced pressure. Thus, a model of an organic EL display was produced.
Next, the model was treated at 80° C. and 85% RH for 500 hours. Thereafter, the model was cooled to room temperature (25° C.), subsequently the organic EL element was operated, and dark spots (non-luminescent sites) were observed.
A case in which the area of dark spots was less than 5% of the total area was rated as "○" for having an excellent ability to suppress the generation of dark spots, and a case in which the area of dark spots was 5% or more was rated as "X" for having a poor ability to suppress the generation of dark spots.

TABLE 1

|  |  | Example 1 | Example 2 | Example 3 | Example 4 | Example 5 | Example 6 | Example 7 | Example 8 | Example 9 | Example 10 | Example 11 | Example 12 | Example 13 | Example 14 |
|---|---|---|---|---|---|---|---|---|---|---|---|---|---|---|---|
| Thermoplastic resin A [parts by weight] | A1 | 20 | 20 |  |  |  |  |  | 30 | 20 |  | 20 |  |  |  |
|  | A2 |  |  | 20 |  | 10 |  |  |  |  |  |  |  |  |  |
|  | A3 |  |  |  | 20 | 10 |  |  |  |  | 20 |  | 20 | 20 | 20 |
|  | A4 |  |  |  |  |  | 20 |  |  |  |  |  |  |  |  |

TABLE 1-continued

|  |  | Example 1 | Example 2 | Example 3 | Example 4 | Example 5 | Example 6 | Example 7 | Example 8 | Example 9 | Example 10 | Example 11 | Example 12 | Example 13 | Example 14 |
|---|---|---|---|---|---|---|---|---|---|---|---|---|---|---|---|
|  | A5 |  |  |  |  |  |  | 20 |  |  |  |  |  |  |  |
|  | A6 |  |  |  |  |  |  |  |  |  |  |  |  |  |  |
|  | A7 |  |  |  |  |  |  |  |  |  |  |  |  |  |  |
|  | A8 |  |  |  |  |  |  |  |  |  |  |  |  |  |  |
| Tackifying resin B | B1 | 70 |  | 70 | 70 | 70 | 70 | 70 | 50 | 70 | 70 | 70 | 70 | 70 | 70 |
| [parts by weight] | B2 |  | 70 |  |  |  |  |  |  |  |  |  |  |  |  |
|  | B3 |  |  |  |  |  |  |  |  |  |  |  |  |  |  |
|  | B4 |  |  |  |  |  |  |  |  |  |  |  |  |  |  |
| Desiccant C | C1 | 8.5 | 8.5 | 8.5 | 8.5 | 85 | 8.5 | 8.5 | 8.5 |  |  |  |  | 5.5 | 18 |
| [parts by weight] | C2 |  |  |  |  |  |  |  |  | 8 | 8 |  |  |  |  |
|  | C3 |  |  |  |  |  |  |  |  |  |  | 11 | 11 |  |  |
|  | C4 |  |  |  |  |  |  |  |  |  |  |  |  |  |  |
|  | C5 |  |  |  |  |  |  |  |  |  |  |  |  |  |  |
| Plasticizer D | D1 | 10 | 10 | 10 | 10 | 10 | 10 | 10 | 20 | 10 | 10 | 10 | 10 | 10 | 10 |
| [parts by weight] |  |  |  |  |  |  |  |  |  |  |  |  |  |  |  |
| Acid value [mg CH$_3$ONa/g] |  | 0.0 | 0.0 | 0.0 | 2.0 | 1.0 | 0.0 | 0.0 | 0.0 | 0.0 | 2.0 | 0.0 | 2.0 | 2.0 | 2.0 |
| AM/Y |  | 0 | 0 | 0 | 97 | 49 | 0 | 0 | 0 | 0 | 96 | 0 | 101 | 151 | 46 |
| Light transmittance [%] |  | 92 | 92 | 92 | 90 | 91 | 92 | 92 | 92 | 90 | 88 | 86 | 85 | 90 | 88 |
| Solution stability |  | ○ | ○ | ○ | ○ | ○ | ○ | ○ | ○ | ○ | ○ | ○ | ○ | ○ | ○ |
| Adhesive force [N/25 mm] |  | 10 | 11 | 9.5 | 17 | 15 | 11 | 12 | 14 | 11.5 | 18 | 11 | 17 | 15 | 18.5 |
| Retentive power [mm] |  | 3 | 2.7 | 3 | 3.3 | 3.3 | 4 | 3.8 | 4.5 | 2.5 | 3 | 2.5 | 3.1 | 3.2 | 2.7 |
| Dark spots |  | ○ | ○ | ○ | ○ | ○ | ○ | ○ | ○ | ○ | ○ | ○ | ○ | ○ | ○ |

TABLE 2

|  |  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 | Comparative Example 11 |
|---|---|---|---|---|---|---|---|---|---|---|---|---|
| Thermoplastic resin A | A1 |  |  |  |  | 20 | 20 | 20 | 20 | 20 |  | 50 |
| [parts by weight] | A2 |  |  |  |  |  |  |  |  |  |  |  |
|  | A3 |  |  |  | 20 |  |  |  |  |  |  |  |
|  | A4 |  |  |  |  |  |  |  |  |  |  |  |
|  | A5 |  |  |  |  |  |  |  |  |  |  |  |
|  | A6 | 20 |  |  |  |  |  |  |  |  |  |  |
|  | A7 |  | 20 |  |  |  |  |  |  |  |  |  |
|  | A8 |  |  | 30 |  |  |  |  |  |  |  |  |
| Tackifying resin B | B1 | 70 | 70 | 70 | 70 |  |  | 70 | 70 | 70 | 80 |  |
| [parts by weight] | B2 |  |  |  |  |  |  |  |  |  |  |  |
|  | B3 |  |  |  |  | 70 |  |  |  |  |  |  |
|  | B4 |  |  |  |  |  | 70 |  |  |  |  |  |
| Desiccant C | C1 | 8.5 | 8.5 | 8.5 | 4 | 8.5 | 8.5 |  |  |  | 8.5 | 8.5 |
| [parts by weight] | C2 |  |  |  |  |  |  |  |  |  |  |  |
|  | C3 |  |  |  |  |  |  |  |  |  |  |  |
|  | C4 |  |  |  |  |  |  |  | 7 |  |  |  |
|  | C5 |  |  |  |  |  |  |  |  | 12.5 |  |  |
| Plasticizer D | D1 | 10 | 10 |  | 10 | 10 | 10 | 10 | 10 | 10 | 20 | 50 |
| [parts by weight] |  |  |  |  |  |  |  |  |  |  |  |  |
| Acid value [mg CH$_3$ONa/g] |  | 0.0 | 0.0 | 0.0 | 2.0 | 0.0 | 7.0 | 0.0 | 0.0 | 0.0 | 0.0 | 0.0 |
| AM/Y |  | 0 | 0 | 0 | 207 | 0 | 341 | 0 | 0 | 0 | 0 | 0 |
| Light transmittance [%] |  | 81 | 83 | 92 | — | 82 | — | 92 | 70 | 75 | 92 | 91 |
| Solution stability |  | ○ | ○ | ○ | X | ○ | X | ○ | ○ | ○ | ○ | ○ |
| Adhesive force [N/25 mm] |  | 11.5 | 10 | 9 | — | 10 | — | 9 | 10 | 9 | 0.2 | 4 |
| Retentive power [mm] |  | 3.5 | 3.5 | >25 | — | 3 | — | 3.5 | 3 | 3 | >25 | >25 |
| Dark spots |  | X | X | ○ | — | ○ | — | X | ○ | ○ | X | ○ |

Examples 1 to 14 each contained a thermoplastic resin, a tackifying resin, and an organometallic compound represented by formula (Chemical Formula 1) as essential components, had a light transmittance of 85% or higher for light having a wavelength of 550 nm at a thickness of 0.1 mm, and satisfied the relationship: AM/Y<162, and the thermoplastic resins thereof included hydrides of styrene-based A-B-A type triblock bodies. Therefore, Examples 1 to 14 exhibited satisfactory results for all the characteristics of solution stability, adhesive force, retentive power, and dark spots.

On the contrary, Comparative Examples 1 and 2 exhibited low weather resistance, had dark spots generated therein, and had light transmittances of less than 85%, because the styrene-based A-B-A type triblock body was not hydrogenated. Furthermore, Comparative Example 3 had low cohesive force and poor retentive power because the thermoplastic resin was not a styrene triblock copolymer. As a result, the sealing substrate was shifted in the atmosphere of the dark spot test (85° C., 85%), and the organic EL element was exposed; therefore, dark spots were generated. In Comparative Examples 4 and 6, since the value of AM/Y was 162 or more, the varnish of the transparent resin composition for organic EL element sealing gelled and could not be processed into sheets. In Comparative Example 5, since the tackifying resin was not hydrogenated, transparency was decreased, and the light transmittance was less than 85%. Comparative Example 7 did not contain the organometallic compound represented by formula (Chemical Formula 1), and therefore, growth of dark spots was recognized. In Comparative Example 8, since the organometallic compound did not have ester bonds, transparency was decreased, and the light transmittance was less than 85%. In Comparative Example 9, since the organometallic compound had more than 8 carbon number, the light transmittance was less than 85%. Comparative Example 10 exhibited low adhesive force and low retentive power because the composition did not contain a thermoplastic resin. As a result, the sealing substrate was shifted in the atmosphere of the dark spot test, and the organic EL element was exposed, causing the generation of dark spots. Comparative Example 11 did not contain a tackifying resin, and therefore, the composition exhibited low cohesive force and poor retentive power. As a result, the sealing substrate was shifted in the atmosphere of the dark spot test, and the organic EL element was exposed; therefore, dark spots were generated.

EXPLANATIONS OF LETTERS OR NUMERALS

1: RESIN SHEET FOR ORGANIC ELECTROLUMINESCENT ELEMENT SEALING
2: SUBSTRATE SHEET
3: SEALING LAYER
4: RELEASE FILM
5: ELEMENT SUBSTRATE
6: ORGANIC EL ELEMENT
61: ANODE
62: ORGANIC LAYER
63: CATHODE
7: TRANSPARENT RESIN LAYER FOR ORGANIC EL ELEMENT SEALING
8: SEALING SUBSTRATE
9: CASE
10: ORGANIC EL DISPLAY

The invention claimed is:

1. A transparent resin composition for organic electroluminescent element sealing, comprising:
a thermoplastic resin comprising a hydride of a styrene-based A-B-A triblock body;
a tackifying resin which is at least one selected from the group consisting of a hydride of a C5-based petroleum resin, a hydride of a C9-based petroleum resin, and a hydride of a petroleum resin obtained by copolymerizing a C5-based petroleum resin and a C9-based petroleum resin; and
an organometallic compound comprising an ester bond and represented by Formula (1),

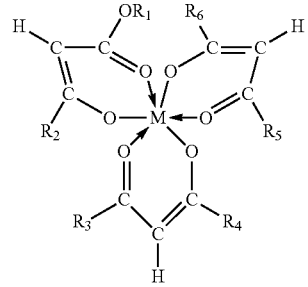

where $R_1$, $R_2$, $R_4$, and $R_6$ each represents an organic group comprising an alkyl group, an aryl group, a cycloalkyl group, or an acyl group each having a carbon number of 1 or more and 8 or less; $R_3$ and $R_5$ each represents an organic group comprising an alkyl group, an aryl group, an alkoxy group, a cycloalkyl group, or an acyl group each having a carbon number of 1 or more and 8 or less; M represents a trivalent metal atom; and $R_1$ to $R_6$ are identical organic groups or different organic groups,
wherein
the transparent resin composition has a light transmittance of 85% or higher for light having a wavelength of 550 nm at a thickness of 0.1 mm, and
the transparent resin composition satisfies a relationship: AM/Y<162, where A (mg $CH_3ONa/g$) represents an acid value of the transparent resin composition excluding the organometallic compound, M represents a weight average molecular weight of the organometallic compound, and Y represents a weight ratio of the organometallic compound with respect to 100 parts by weight of the resin components.

2. The transparent resin composition for organic electroluminescent element sealing according to claim 1,
wherein the styrene-based A-B-A triblock body is at least one selected from the group consisting of a styrene-ethylene-butylene-styrene copolymer, a styrene-ethylene-propylene-styrene copolymer, a styrene-ethylene-ethylene-propylene-styrene copolymer, and a styrene-isobutylene-styrene copolymer.

3. The transparent resin composition for organic electroluminescent element sealing according to claim 1,
wherein the tackifying resin comprises a hydride of a C5-based petroleum resin.

4. A resin sheet for organic electroluminescent element sealing, comprising:
a sealing layer formed from the transparent resin composition for organic electroluminescent element sealing according to claim 1.

5. An image display device, comprising:
an organic electroluminescent element;
a sealing substrate; and
the resin sheet for organic electroluminescent element sealing according to claim 4 interposed between the organic electroluminescent element and the sealing substrate.

6. The transparent resin composition for organic electroluminescent element sealing according to claim 1, wherein the tackifying resin comprises a hydride of a C9-based petroleum resin.

7. A resin sheet for organic electroluminescent element sealing, comprising:

a sealing layer formed from the transparent resin composition for organic electroluminescent element sealing according to claim 2.

8. The transparent resin composition for organic electroluminescent element sealing according to claim 1, further comprising a plasticizer.

9. The transparent resin composition for organic electroluminescent element sealing according to claim 1,
wherein the tackifying resin comprises a hydride of a petroleum resin obtained by copolymerizing a C5-based petroleum resin and a C9-based petroleum resin.

* * * * *